United States Patent [19]
Yang et al.

[11] Patent Number: 6,052,305
[45] Date of Patent: Apr. 18, 2000

[54] ERASING CIRCUIT FOR A FLASH MEMORY DEVICE HAVING A TRIPLE WELL STRUCTURE

[75] Inventors: Tae Hum Yang; Joo Young Kim, both of Seoul; Young Dong Joo, Kyungki-Do; Jong Bae Jeong, Kyungki-Do; Jong Seuk Lee, Kyungki-Do; Il Hyun Choi, Seoul; Mun Pyo Hong, Kyungki-Dol; Chae Hyun Jung, Kyungsangbuk-Do, all of Rep. of Korea

[73] Assignee: Hyundai Electronics Industries Co., Ltd., Ichon-Shi, Rep. of Korea

[21] Appl. No.: 09/143,409

[22] Filed: Aug. 28, 1998

[30] Foreign Application Priority Data

Aug. 30, 1997 [KR] Rep. of Korea ...................... 97-43845
Aug. 12, 1998 [KR] Rep. of Korea ...................... 98-32689

[51] Int. Cl.[7] .................................................. G11C 16/04
[52] U.S. Cl. .............................. 365/185.18; 365/185.18; 365/185.19; 365/185.27; 365/185.29; 365/185.23
[58] Field of Search ........................ 365/185.18, 185.19, 365/185.27, 185.29, 185.23

[56] References Cited

U.S. PATENT DOCUMENTS

| | | | |
|---|---|---|---|
| 4,667,312 | 5/1987 | Doung et al. | 365/189 |
| 5,457,652 | 10/1995 | Brahmbhatt | 365/185.06 |
| 5,862,078 | 1/1999 | Yeh et al. | 365/185.29 |
| 5,872,733 | 2/1999 | Buti et al. | 365/185.19 |
| 5,894,438 | 4/1999 | Yang et al. | 365/185.18 |

FOREIGN PATENT DOCUMENTS

| | | | |
|---|---|---|---|
| 05055606 | 3/1993 | Japan | H01L 29/788 |
| 06151785 | 5/1994 | Japan | H01L 27/115 |
| 08078546 | 3/1996 | Japan | H01L 21/8247 |

*Primary Examiner*—David Nelms
*Assistant Examiner*—Connie C. Yoha
*Attorney, Agent, or Firm*—Cohen, Pontani, Lieberman & Pavane

[57] ABSTRACT

The present invention discloses a flash memory device, a first well and second well are formed in a substrate, a plurality of memory cell are formed in the second well and arranged in an array having a multiplicity of bit lines and word lines. Voltage is applied to the first well and second well, respectively, with time interval so that an over erasing of the memory cell and lowering of cycling characteristic can be prevented.

20 Claims, 5 Drawing Sheets

ERASING CIRCUIT FOR A FLASH MEMORY DEVICE HAVING A TRIPLE WELL STRUCTURE

BACKGROUND OF THE INVENTION

1. Field of the Invention

The present invention relates to a flash memory device, and more particularly to a flash memory device which has a switching circuit for applying a voltage to wells with a time interval when flash memory cells which have a triple well structure are erased.

2. Description of the Prior Art

In general, a memory device such as flash electrically erasable and programmable read only memory (EEPROM) has both functions of electrically programming and erasing, and is classified into a the stack-gate type and the split-gate type depending on a shape of gate electrode thereof. Now, details of the conventional stack-gate flash memory cell will be described with reference to FIG. 1.

In the conventional stack-gate type flash memory cell, as shown in FIG. 1, a tunnel oxide layer 3, a floating gate 4, a dielectric layer 5 and a control gate 6 are sequentially stacked on a silicon substrate 1 in which a well 2 is formed to form a gate electrode. Impurity ions are injected into the substrate 1 at both sides of the gate electrode, therefore a source 7 and a drain 8 are formed. The operation of programming and erasing of the flash memory cell as described above will be described with reference to FIG. 2 to FIG. 4.

To program an information to the flash memory cell, that is, to charge electric charge to the floating gate 4, a higher voltage $V_G$ of 9V is applied to the control gate 6, a supply voltage $V_D$ of 5V is applied to the drain 8, and the source 7 and the well 2 are grounded, respectively, as shown in FIG. 2. Then, channel is formed between the source 7 and the drain 8 due to the higher voltage $V_G$ applied to the control gate 6, and high electric field zone is formed on the substrate 1 at the side of the drain 6 due to the supply voltage $V_D$ applied to the drain 8. At this time, a part of electrons existing in the channel receive an energy from the high electric field zone and become hot electrons, and a part of the hot electrons are injected into the floating gate 4 through the tunnel oxide layer 3 by an electrical field formed in a vertical direction due to the high voltage applied to the control gate 6. Accordingly, a threshold voltage $V_T$ of the flash memory cell rises by such injection of hot electrons.

To erase the information programmed in the flash memory cell, that is, to discharge electric charge stored in the floating gate 4, a negative voltage $V_G$ of −8V is applied to the control gate 6, voltage $V_S$ of 5V is applied to the source 7, and the drain 8 and the well 2 are grounded, respectively, as shown in FIG. 3 and FIG. 4. Then, the electrons injected into the floating gate 3 are moved to the source 7 due to the F-N (fowler-nordheim) tunneling phenomenon, so that threshold voltage $V_T$ of memory cells is lowered.

When the erasing operation is performed, a band to band leakage current occurs by the electric field formed between the floating gate 4 and the source 7, and the band to band leakage current is accelerated by the voltage between the source 7 and the well 2, whereby the current is increased. Also, the generated holes pass through the tunnel oxide layer 3 and are injected into the floating gate 4, or trapped in the tunnel oxide layer 3 adjacent to the source 7. By such phenomenon, an over erasing occurs or characteristic of cycling is degraded.

To prevent such phenomenon, the source 7 is formed with the double diffused drain (DDD) structure. However, a high integration of device is difficult due to a side diffusion of impurity ions.

SUMMARY OF THE INVENTION

Accordingly, an object of the present invention is to overcome the above-noted shortcoming of the conventional flash memory device and provide a flash memory device which have a plurality of memory cells formed on the silicon substrate on which wells having a triple structure are formed and have a switching circuit to apply voltage two wells with time interval when an erasing operation is performed.

A flash memory device according to the present invention comprises the first well formed in a substrate, a second well formed in said first well, a plurality of memory cells disposed in said second well and arranged in an array having a multiplicity of bit lines and word lines, a charge pump circuit for generating a pumping voltage to program, read and erase the memory cells and means for applying the pumping voltage to the first well and second well with a time interval in erasing operation. The flash memory device further comprises a third switching means for discharging the voltage applied to the first well and the second well and a second delay means for delaying a discharge time of the voltage applied to the first well.

The means for applying the pumping voltage comprises a first switching mean for applying selectively the pumping voltage to the first well in erasing operation, a second switching means for applying selectively the pumping voltage to the second well in erasing operation, a first delay means for delaying the pumping voltage to be applied to the second well through the second switching means for definite time and a driving circuit for driving the first and the second switching means.

The driving circuit comprises a logical element for logical combining a first and second signals which have the same state with the erase signal and a high voltage latch circuit to which an output signal of the logical element and the pumping voltage are input. The logical element is an NAND gate, the first and the second switching means are PMOS transistors. Also, the third switching means is a NMOS transistor.

BRIEF DESCRIPTION OF THE DRAWINGS

Other objects and advantages of the present invention will be understood by reading the detailed explanation of the embodiment with reference to the accompanying drawings in which.

Similar reference characters refer to similar parts in the several views of the drawings.

DETAILED DESCRIPTION OF THE PREFERRED EMBODIMENTS

Figure 1:
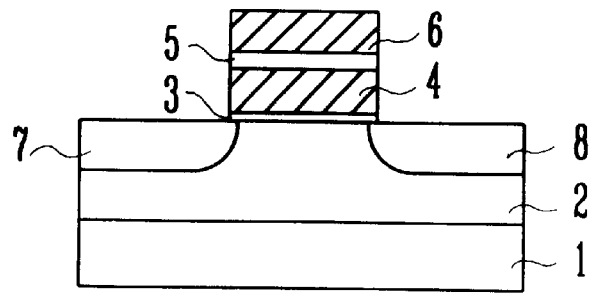
FIG. 1 is a sectional view of the conventional flash memory cell.
Figure 2:
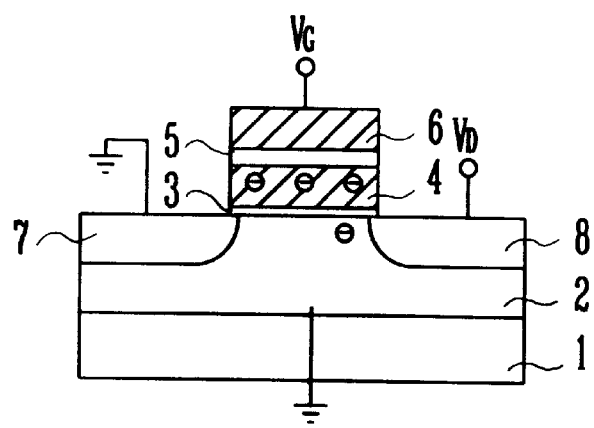
FIG. 2 is a view to illustrate a programming operation of the conventional flash memory cell.
Figure 3:
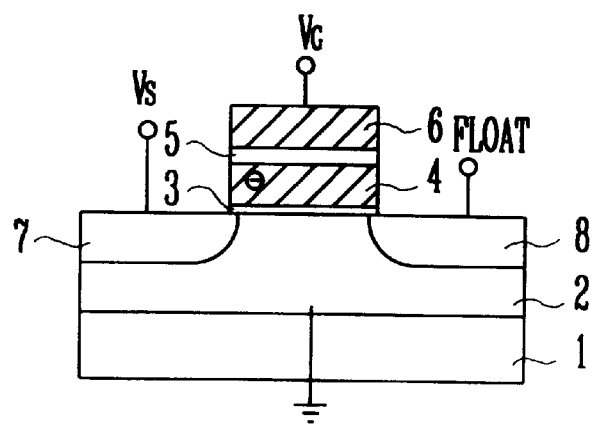
FIG. 3 is a view to illustrate an erasing operation of the conventional flash memory cell.
Figure 4:
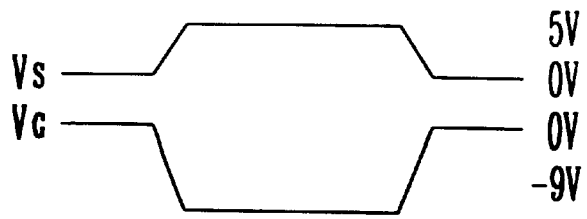
FIG. 4 is a timing diagram to describe FIG. 3.
Figure 5:
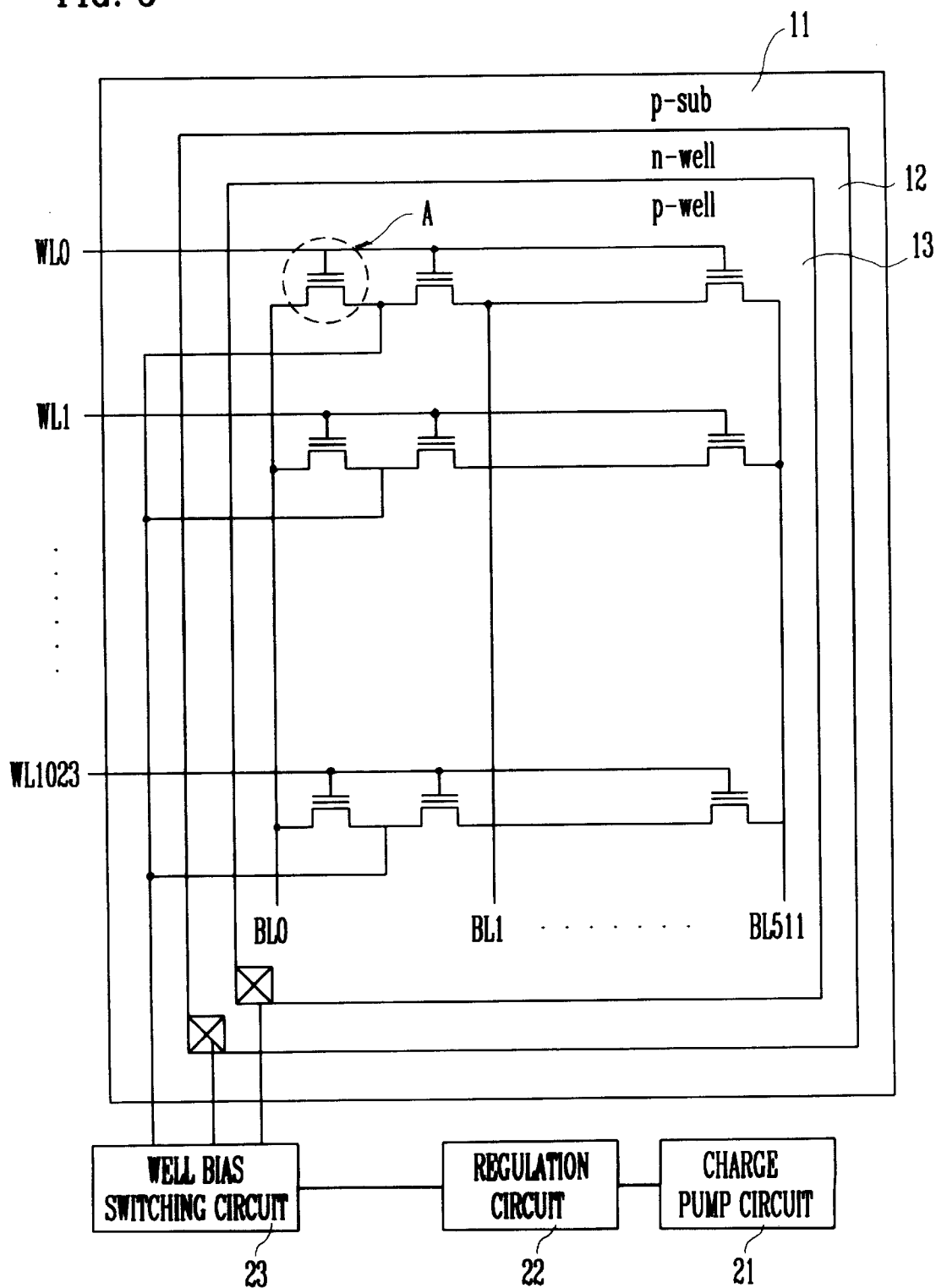
FIG. 5 is a schematic diagram of a flash memory device according to the present invention.

FIG. 5 is a schematic diagram of a flash memory device, which have a triple well structure, according to the present invention, assuming that a first well 12 is a n-well and a second well 13 is a p-well. The first well 12 is formed on a substrate 11, the second well 13 is formed on the first well 12. A plurality of memory cells connected to word lines and bit lines are formed on the second well 13. To erase the flash memory device as described above, a charge pump circuit 21 pumps a voltage required for erasing, a regulation circuit 22 regulates the pumped voltage, and then the voltage is applied to the first well and the second well through a well bias switching circuit 23.

Figure 6:
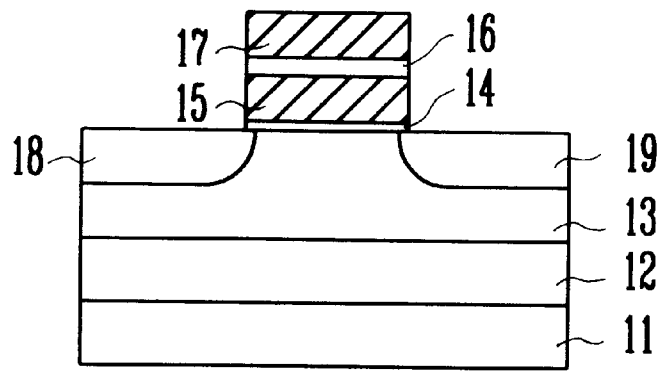
FIG. 6 is a sectional view of a memory cell in a flash memory device according to the present invention.

FIG. 6 is a sectional view of "A" portion of FIG. 5 showing a memory cell of the flash memory device according to the present invention. A tunnel oxide layer 14, a floating gate 15, a dielectric layer 16 and a control gate 17 are sequentially stacked on the second well 13 formed on the substrate 11 to form a gate electrode. Impurity ions are injected into the substrate 11 at both sides of the gate electrode, therefore a source 18 and a drain 19 are formed. The erasing operation of the flash memory cell as described above will be described with reference to FIG. 7 to FIG. 9.

The present invention provides two cases to erase information programmed in the flash memory cell, that is, to discharge electric charge stored in the floating gate 15.

First case

Figure 7:
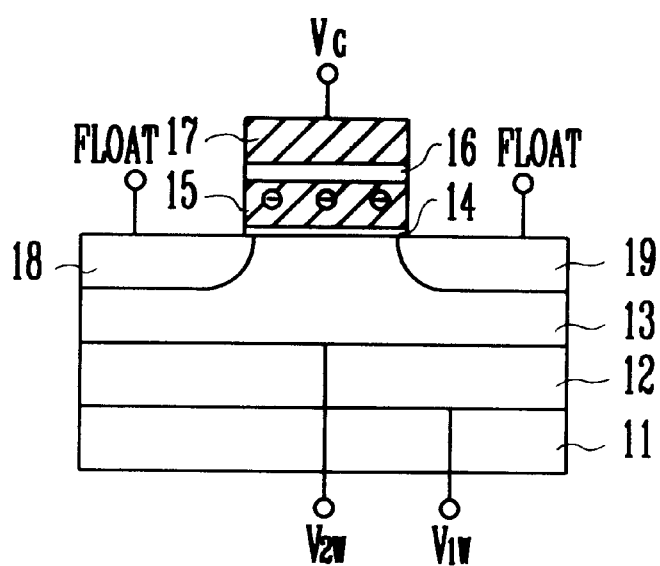
FIG. 7 is a view to illustrate an erasing operation of a flash memory cell according to the present invention.
Figure 8:
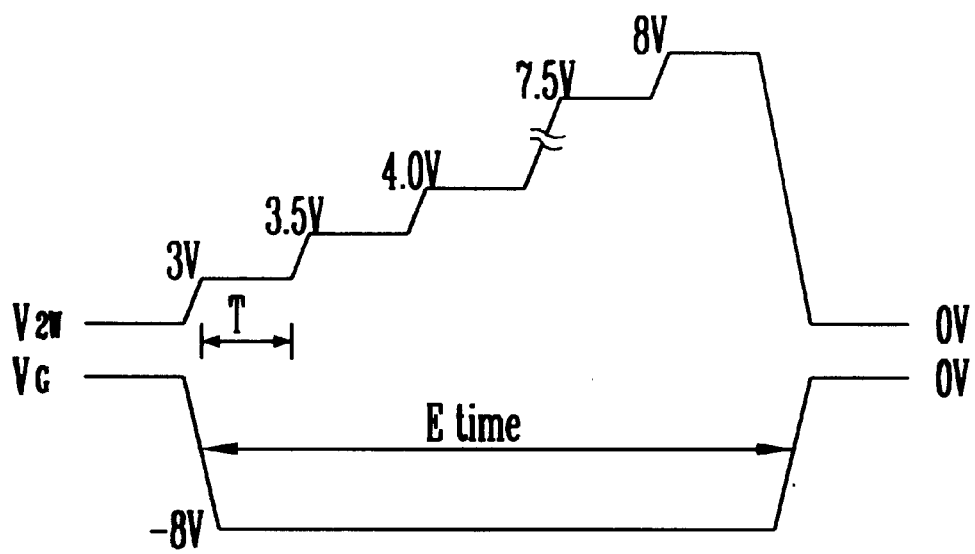
FIG. 8 and FIG. 9 are timing diagrams to describe FIG. 7.

As shown in FIG. 7 and FIG. 8, a negative voltage $V_G$ of −8V is applied to the control gate 17 for erasing time E time, and the source 18 and the drain 19 are floated. Also, a positive voltage $V_{2W}$ escalating step by step is applied to the second well 13. The positive voltage $V_{2W}$ escalates step by step such as 3V, 3.5V, 4.0V, . . . , 7.5V and 8.0V for erasing time E time, and the time for keeping the voltage of each step shall be 5 to 10 ms or so. Also, a voltage $V1_W$ which is same as the positive voltage $V_{2W}$ applied to the second well 13 is applied to the first well 12 with a time interval.

Second embodiment

Figure 9:
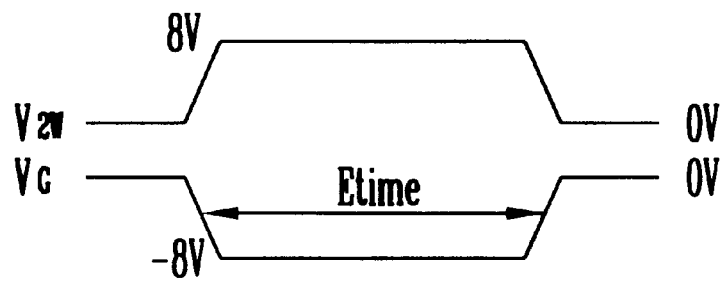

As shown in FIG. 7 and FIG. 9, a negative voltage $V_G$ of −8V is applied to the control gate 17 for erasing time E time, and the source 18 and the drain 19 are floated. Also, a positive voltage $V_{2W}$ of 8V is applied to the second well 13. Also, the voltage $V1_W$ which is same as the voltage $V_{2W}$ applied to the second well 13 is applied to the first well 12 with a time interval.

To execute the above erasing operation, the voltages $V_{1W}$ and $V_{2W}$ are applied to the first well and second well, respectively, with a time interval. For this operation, a well bias switching circuit as shown in FIG. 10 is used.

Figure 10:
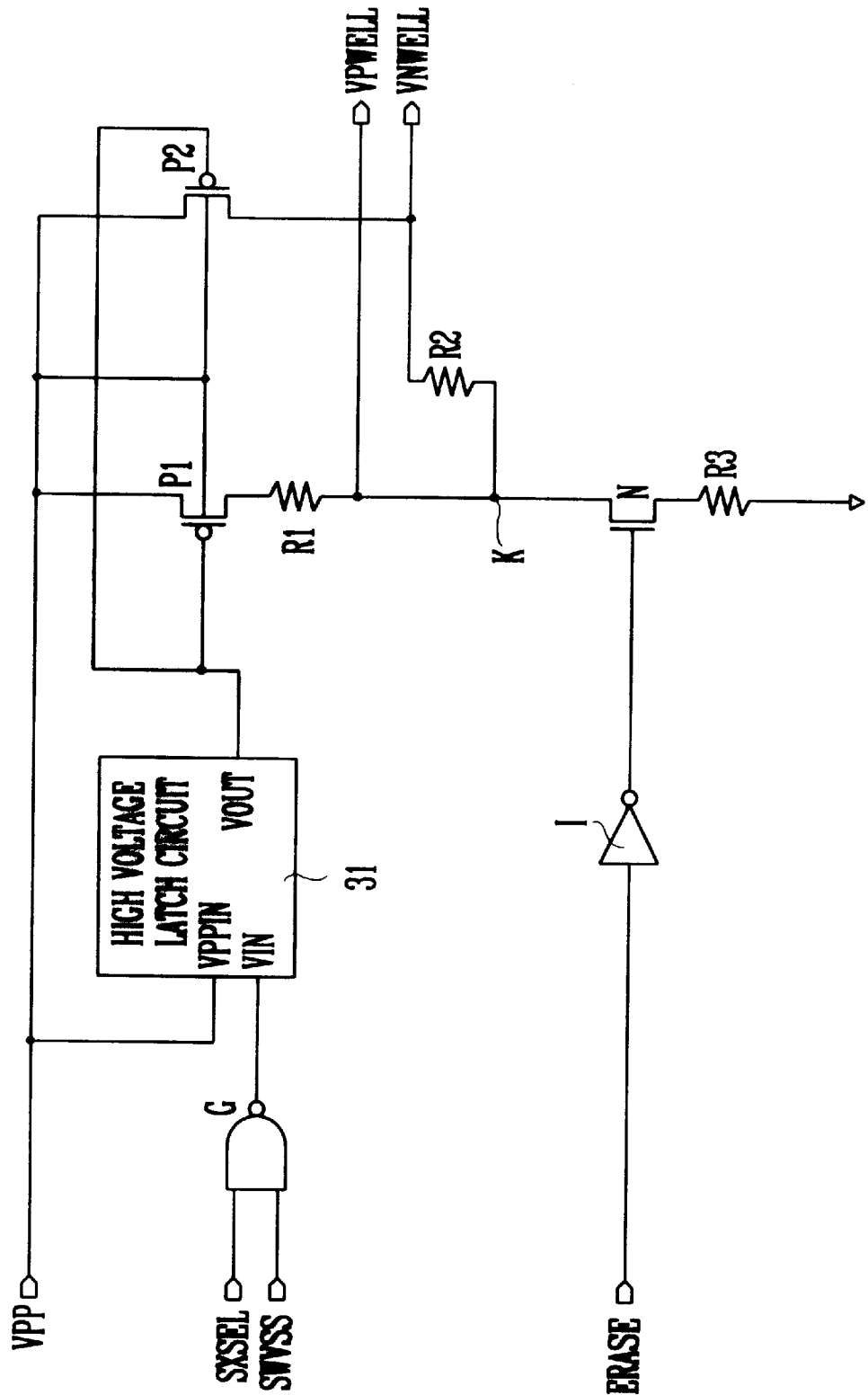
FIG. 10 is a circuit diagram of a well bias switching circuit of flash memory device according to the present invention.

FIG. 10 shows a well bias switching circuit used in a flash memory device according to the present invention.

A sector select enable signal SXSEL and a ground voltage switching signal SWVSS are input to a NAND gate G. A pumping voltage VPP is input to a high voltage latch circuit 31 through a first input terminal VPPIN, an output signal of the NAND gate G is input to the high voltage latch circuit 31 through the second input terminal VIN. An output signal of the high voltage latch circuit 31 is input to a first and the second PMOS transistors P1 and P2 so that the pumping voltage VPP is applied to the p-well (the first well) and the n-well (the second well). A first resistor R1 is connected between the first PMOS transistor P1 and the p-well. A NMOS transistor N is connected between a node K and a ground terminal. An erase signal ERASE is inverted by an inverter, the inverted erase signal is input the NMOS transistor N as a gate input.

A second resistor R2 is connected between the n-well and the node K.

Wherein, the sector select enable signal SXSEL is a signal to select a sector to be erase. The ground voltage switching signal SWVSS is a signal for maintaining a potential of the well as a ground potential and generated by the erasing signal or the logic which decides an erasing mode.

Method of driving the well bias switching circuit of the flash memory device as described above is explained as follows.

To perform the erasing operation, the erase signal ERASE in high state and the pumping voltage VPP must be input, and the sector select enable signal SXSEL and the ground voltage switching signal SWVSS must keep in high state.

The erase signal ERASE in the high state is inverted by the inverter I and the inverted erase signal is then input to the NMOS transistor N which acts as a switching means so that the NMOS transistor N is turned off and a ground voltage is applied to the node K. The pumping voltage VPP is input to the first input terminal VPPIN of the high voltage latch circuit 31, and applied to the first and the second PMOS transistors P1 and P2 which act as switching means. The sector select enable signal SXSEL and the ground voltage switching signal SWVSS in the high state are input to the NAND gate G, and the NAND gate G outputs a signal in low state. The output signal of the NAND gate G is input to the high voltage latch circuit 31 through the second input terminal VIN. The high voltage latch circuit 31, which has the first input terminal VPPIN through which the pumping voltage VPP is input and second input terminal VIN through which the output signal in low state of the NAND gate G is input, outputs a signal in low state.

The first and the second PMOS transistors P1 and P2 are turned on due to the output signal of the high voltage latch circuit 31. The pumping voltage VPP is applied to the p-well through the first PMOS transistor P1 which is turned on, and applied to the n-well through the second PMOS transistor P2 which is turned on. Comparing the pumping voltages VPP applied to the p-well and the n-well, respectively, the pumping voltage is applied to p-well through the first resistor R1 which acts a delay means, whereby the pumping voltage is applied to the p-well after being delayed for definite time. Accordingly, the electric potential of the n-well is higher than that of the p-well for certain time.

If the erase signal ERASE in low state is input and the erasing operation is not executed, the sector select enable signal SXSEL and the ground voltage switching signal SWVSS must be kept in low state. The sector select enable signal SXSEL and the ground voltage switching signal SWVSS in low state become the high state by the NAND gate G. When the pumping voltage VPP and the output signal in high state of the NAND gate G are input to the high voltage latch circuit 31 through the first input terminal VPPIN and the second input terminal VIN, respectively, the high voltage latch circuit 31 outputs a signal in high state.

Due to the output signal in high state of the high voltage latch circuit 31, the first and second PMOS transistors P1 and P2 are turned off so that the pumping voltage VPP is not applied to the p-well and the n-well. The erase signal ERASE in low state is inverted by the inverter I and becomes in high state. The inverted erase signal is input to the NMOS transistor N so that the NMOS transistor N is turned on and a ground voltage is applied to the node K.

As a result, the voltages which are applied to the p-well and the n-well, respectively, are discharged to the ground. That is, the voltage applied to the p-well is discharged to the ground through the NMOS transistor N, however, the voltage applied to the n-well is discharged to the ground through the second resistor R2 which acts as a delay means. Therefore, the voltage applied to the n-well is discharged after the time delay. As a result, the electric potential of the n-well is higher than that of the p-well for any time.

When the erasing bias voltage is applied to the flash memory cell through the circuit as described above, the electrons injected into the floating gate 15 move to the second well 13 by the tunneling phenomenon as shown in FIG. 8, so that the threshold voltage $V_T$ of the memory cell be lowered. When the above erasing operation is performed, the source 18 keeps in the floating state. Therefore, the band to band leakage current generated by the electric field which is formed between the floating gate 15 and the source 18 where the floating gate 15 and the source 18 are overlapped, is reduced so that a flow of current generated by potential difference between the source 18 and the second well 13 is prevented. Also, voltage is applied to the first well and second well, respectively, with time interval so that an over erasing of the memory cell and degrading of cycling characteristic can be prevented due to reduction of hole generation.

In the present invention as described above, it is not necessary to form the source which has the double diffused drain (DDD) structure so that the integration of device can be increased efficiently. Also, a diode action of the first well and second well may be prevented efficiently.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash memory device comprising;
    a first well formed in a substrate;
    a second well formed in said first well;
    a plurality of memory cells disposed in said second well and arranged in an array having a multiplicity bit lines and word lines, each of said cell including;
    (a) a drain;
    (b) a source spaced apart from said drain so as to define a channel in aid second well intermediate said source and drain;
    (c) a floating gate disposed over said channel and insulated from said channel; and
    (d) a control gate disposed over said floating gate and insulated from said floating gate;
    a charge pump circuit for generating a pumping voltage to program, read and erase said memory cells;
    means for alternately applying said pumping voltage to said first well and second well with time interval in erasing operation, said means comprising;
    a first switching means for applying selectively said pumping voltage to said first well in erasing operation;
    a second switching means for applying selectively said pump voltage to said second well through said second switching means for definite time; and
    a driving circuit for driving said first and second switching means.

2. The flash memory device of claim 1 further comprising;
    a third switching means for discharging the voltage applied to said first well and said second well, said third switching means operated in response to an erasing signal; and
    a second delay means for delaying a discharge time of the voltage applied to said first well.

3. The flash memory device of claim 1 wherein said driving circuit comprises a logical element for logical combining a first and second signals which have the same state with said erase signal and a high voltage latch circuit to which an output signal of said logical element and said pumping voltage are input.

4. The flash memory device of claim 3 wherein said logical element is an NAND gate.

5. The flash memory device of claim 1 wherein said first and the second switching means are PMOS transistors.

6. The flash memory device of claim 2 wherein said third switching means is a NMOS transistor.

7. The flash memory device of claim 1 wherein said pumping voltage applied to said first well and second well is a positive voltage and escalates from 3V to 8V step by step for erasing time and a negative voltage of −8V is applied to said control gate.

8. The flash memory device of claim 1 wherein a positive voltage of 8V is applied to said firrst well and second well, and a negative voltage of −8V is applied to said control gate.

9. A flash memory device comprising;
    a first well formed in a substrate;
    a second well formed in said first well;
    a plurality of memory cells disposed in said second well and arranged in an array having a multiplicity bit lines and word lines, each of said cell including:
    (a) a drain;
    (b) a source spaced apart from said drain so as to define a channel in said second well intermediate said source and drain;
    (c) a floating gate disposed over said channel and insulated from said channel; and
    (d) a control gate disposed over said floating gate and insulated from said floating gate;
    a charge pump circuit for generating a pumping voltage to program, read and erase said memory cells;
    means for alternately applying said pumping voltage to said first well and second well with time interval in erasing operation, said means comprising;
    a first switching means for applying selectively said pumping voltage to said first well in erasing operation;
    a second switching means for applying selectively said pump voltage to said second well in erasing operation;
    first delay means for delaying said pumping voltage to be applied to said second well through said second switching means for definite time;
    a driving circuit for driving said first and second switching means;
    a third switching means for discharging the voltage applied to said first well and said second well, said third switching means operated in response to an erasing signal; and a second delay means for delaying discharge time of the voltage applied to said first well.

10. The flash memory device of claim 9, wherein said driving circuit comprises a logical element for logical combining first and second signals which have the same state with said erase signal and a high voltage latch circuit to which an output signal of said logical element and said pumping voltage are input.

11. The flash memory device of claim 10, wherein said logical element is an NAND gate.

12. The flash memory device of claim 9, wherein said first and second switching means are PMOS transistor.

13. The flash memory device of claim 9, wherein said third switching means is a NMOS transistor.

14. The flash memory device of claim 9, wherein said pumping voltage applied to said first and second wells is a positive voltage and escalates from 3V to 8V step by step for erasing time and a negative voltage of -is applied to said control gate.

15. The flash memory device of claim 9, a positive voltage of 8V is applied to said first and second wells, and a negative voltage of −8V is applied to said control gate.

16. A flash memory device comprising;

a first well formed in a substrate;

a second well formed in said first well;

a plurality of memory cells disposed in said second well and arranged in an array having a multiplicity bit lines and word lines, each of said cell including;

(a) a drain;

(b) a source spaced apart from said drain so as to define a channel in said second well intermediate said source and drain;

(c) a floating gate disposed over said channel and insulated from said channel; and (d) a control gate disposed over said floating gate and insulated from said floating gate;

a charge pump circuit for generating a pumping voltage to said first well and second well with time interval in erasing operation, said means comprising;

a first switching means for applying selectively said pumping voltage to said first well in erasing operation;

a second switching means for applying selectively said pump voltage to said second well in erasing operation;

a first delay means for delaying said pumping voltage to be applied to said second well through said second switching means for definite time;

a driving circuit for driving said first and second switching means, wherein said driving circuit comprises a logical element for logical combining first and second signals which have the same state with said erase signal and a high voltage latch circuit to which an output signal of said logical element and said pumping voltage are input;

a third switching means for discharging the voltage applied to said first well and said second well, said third switching means operated in response to an erasing signal; and a second delay means for delaying discharge time of the voltage applied to said first well.

17. The flash memory device of claim 16, wherein said logical element is an NAND gate.

18. The flash memory device of claim 16, wherein said first and second switching means are PMOS transistor.

19. The flash memory device of claim 16, wherein said third switching means is a NMOS transistor.

20. The flash memory device of claim 16, wherein said pumping voltage applied to said first and second wells is a positive voltage and escalates from 3V to 8V step by step for erasing time and a negative voltage of −8V is applied to said control gate.

* * * * *